(12) United States Patent
Demura et al.

(10) Patent No.: US 12,472,534 B2
(45) Date of Patent: Nov. 18, 2025

(54) SUBSTRATE PROCESSING APPARATUS

(71) Applicant: SHIBAURA MECHATRONICS CORPORATION, Kanagawa (JP)

(72) Inventors: Kensuke Demura, Kanagawa (JP);
Satoshi Nakamura, Kanagawa (JP);
Masaya Kamiya, Kanagawa (JP);
Minami Nakamura, Kanagawa (JP)

(73) Assignee: SHIBAURA MECHATRONICS CORPORATION, Kanagawa (JP)

( * ) Notice: Subject to any disclaimer, the term of this patent is extended or adjusted under 35 U.S.C. 154(b) by 278 days.

(21) Appl. No.: 18/114,377

(22) Filed: Feb. 27, 2023

(65) Prior Publication Data

US 2023/0271231 A1 Aug. 31, 2023

(30) Foreign Application Priority Data

Feb. 28, 2022 (JP) .................................. 2022-029357
Jan. 23, 2023 (JP) .................................. 2023-008307

(51) Int. Cl.
*B08B 7/00* (2006.01)
*H01L 21/67* (2006.01)
*H01L 21/687* (2006.01)

(52) U.S. Cl.
CPC .......... *B08B 7/0092* (2013.01); *B08B 7/0014* (2013.01); *H01L 21/67051* (2013.01); *H01L 21/67109* (2013.01); *H01L 21/68735* (2013.01); *H01L 21/68757* (2013.01); *H01L 21/68785* (2013.01)

(58) Field of Classification Search
None
See application file for complete search history.

(56) References Cited

U.S. PATENT DOCUMENTS

| | | | |
|---|---|---|---|
| 2009/0108545 | A1 | 4/2009 | Kwon et al. |
| 2017/0256433 | A1* | 9/2017 | Hammer ........... H01L 21/67051 |
| 2018/0047559 | A1 | 2/2018 | Kamiya et al. |
| 2019/0244835 | A1 | 8/2019 | Nishida et al. |

FOREIGN PATENT DOCUMENTS

| | | |
|---|---|---|
| JP | 2021163956 A | 9/2004 |
| JP | 2009514208 A | 4/2009 |
| JP | 2010-080584 A | 4/2010 |
| JP | 2013074243 A | 4/2013 |
| JP | 2016189452 A | 11/2016 |
| JP | 2019-140210 A | 8/2019 |
| KR | 10-2018-0018330 A | 2/2018 |

* cited by examiner

*Primary Examiner* — Levon J Shahinian
(74) *Attorney, Agent, or Firm* — Venjuris, P.C.

(57) ABSTRACT

According to one embodiment, a substrate processing apparatus includes: a stage rotatable around a central axis; a plurality of holders provided on the stage to hold a substrate; a cooler capable of supplying a cooling gas to a space between the stage and the substrate; and a liquid supply capable of supplying a liquid to a surface of the substrate on an opposite side to the stage. When holding the substrate, each of the plurality of holders moves toward the central axis along a surface of the stage so as to surround a peripheral edge of the substrate and the space between the stage and the substrate.

10 Claims, 9 Drawing Sheets

SUBSTRATE PROCESSING APPARATUS

CROSS-REFERENCE TO RELATED APPLICATIONS

This application is based on and claims priority from Japanese Patent Application Nos. 2022-029357 and 2023-008307, filed on Feb. 28, 2022 and Jan. 23, 2023, respectively, with the Japan Patent Office, the disclosures of which are incorporated herein in their entireties by reference.

TECHNICAL FIELD

Embodiments of the present disclosure relate to a substrate processing apparatus.

BACKGROUND

A freeze cleaning method has been proposed as a method for removing contaminants such as particles adhering to a surface of a substrate such as an imprint template, a mask for photolithography, or a semiconductor wafer.

In the freeze cleaning method, a liquid such as pure water is supplied to the surface of the substrate first to form a liquid film. Then, a cooling gas is supplied to the side of the surface of the substrate to freeze the liquid film. When the liquid film is frozen to form a frozen film, the contaminants are entrapped in the frozen film, and thus, the contaminants are separated from the surface of the substrate. Subsequently, a liquid such as pure water is supplied to the frozen film to melt the frozen film, so that the contaminants are removed from the surface of the substrate together with the liquid (see, e.g., Japanese Patent Laid-Open Publication No. 2010-080584).

The contaminants may be efficiently removed from the surface of the substrate by using a substrate processing apparatus capable of performing the freeze cleaning method.

SUMMARY

In the substrate processing apparatus discussed above capable of performing the freeze cleaning method, there are problems that, around the substrate, the liquid supplied to the surface of the substrate is frozen or frost is generated due to moisture contained in the atmosphere in which the freeze cleaning processing is performed.

For this reason, it has been required to develop a substrate processing apparatus capable of suppressing unnecessary freezing around the substrate.

A problem to be solved by the present disclosure is to provide a substrate processing apparatus capable of suppressing unnecessary freezing around a substrate.

A substrate processing apparatus according to an embodiment includes: a stage rotatable around a central axis; a plurality of holders provided on the stage to hold a substrate; a cooler capable of supplying a cooling gas to a space between the stage and the substrate; and a liquid supply capable of supplying a liquid to a surface of the substrate on an opposite side to a side of the stage. When holding the substrate, each of the plurality of holders moves toward the central axis along a surface of the stage so as to surround a peripheral edge of the substrate and the space between the stage and the substrate.

According to the embodiment of the present disclosure, a substrate processing apparatus capable of suppressing unnecessary freezing around a substrate is provided.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENTS

Figure 1:
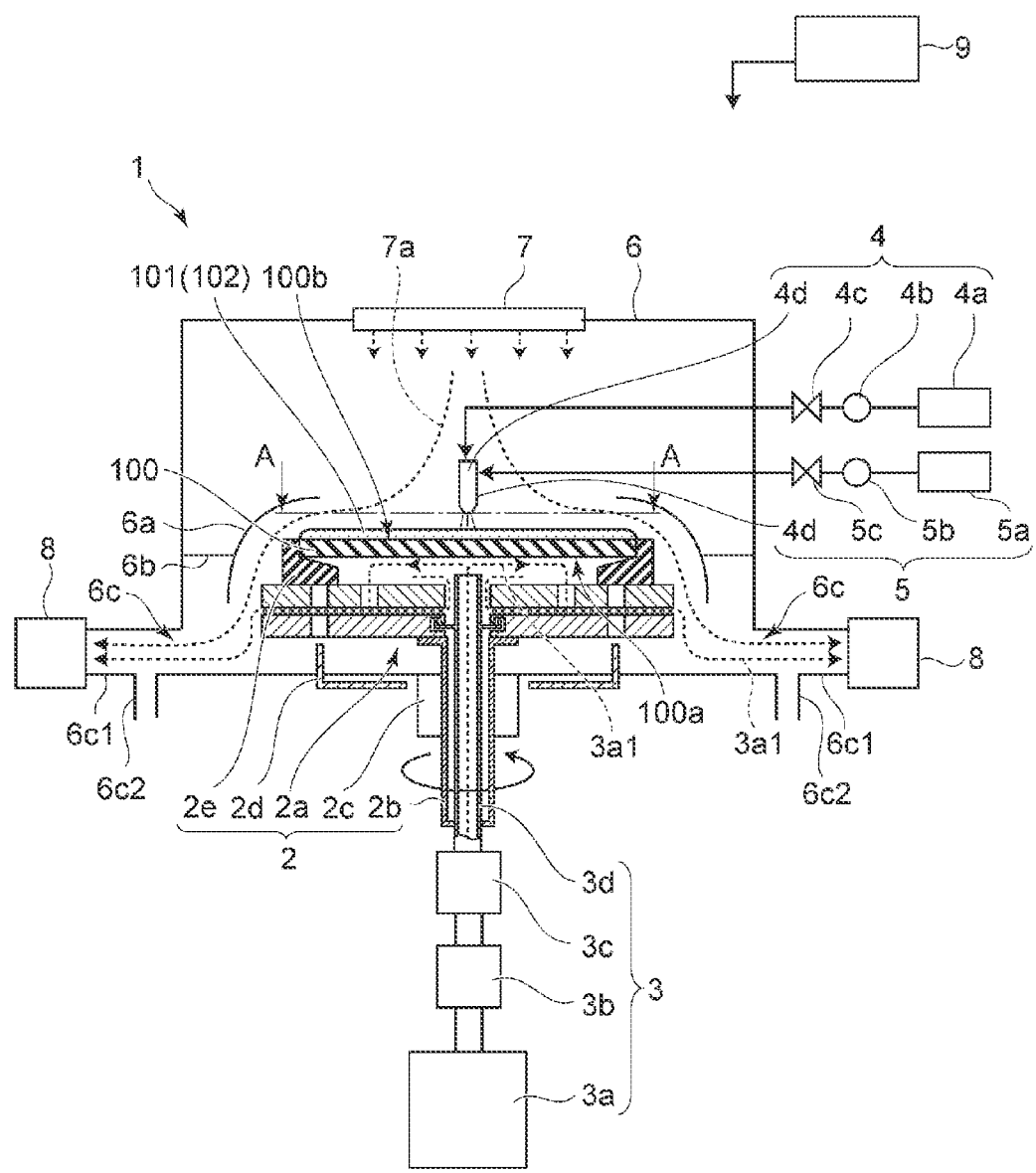
FIG. 1 is a schematic cross-sectional view illustrating a substrate processing apparatus according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, the embodiments will be described with reference to the drawings. In each drawing, the same reference numerals are given to the same components, and detailed description thereof will be omitted as appropriate.

A substrate 100 described below may be, for example, a semiconductor wafer, an imprint template, a mask for photolithography, a plate-shaped body used in micro electro mechanical systems (MEMS), or a flat panel display substrate. However, the substrate 100 is not limited to those illustrated.

On a cleaning surface of the substrate 100, an uneven portion, which is a pattern, may be formed, or the uneven portion may not be formed. The substrate on which the uneven portion is not formed may serve as a substrate before the uneven pattern is formed (e.g., a so-called bulk substrate).

Further, hereinafter, a case where the substrate 100 is a mask for photolithography will be described as an example. In the case where the substrate 100 is a mask for photolithography, the planar shape of the substrate 100 may be, for example, square.

FIG. 1 is a schematic cross-sectional view illustrating a substrate processing apparatus 1 according to the present embodiment.

Figure 2:
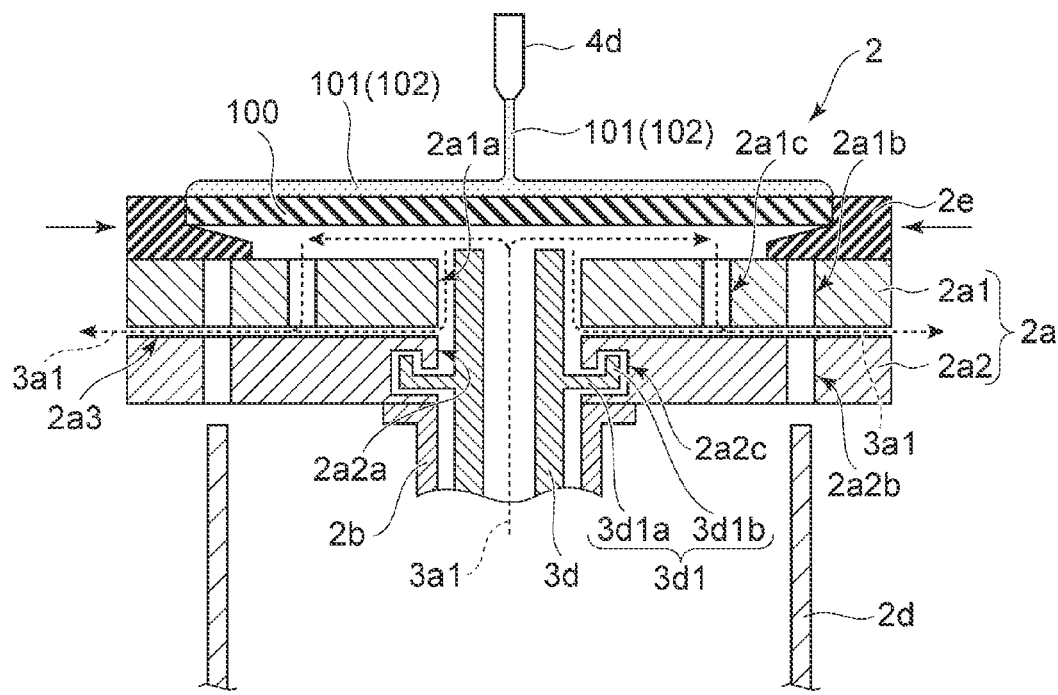
FIG. 2 is a schematic cross-sectional view of a placing unit in FIG. 1.

FIG. 2 is a schematic cross-sectional view of a placing unit 2 in FIG. 1.

Figure 3:
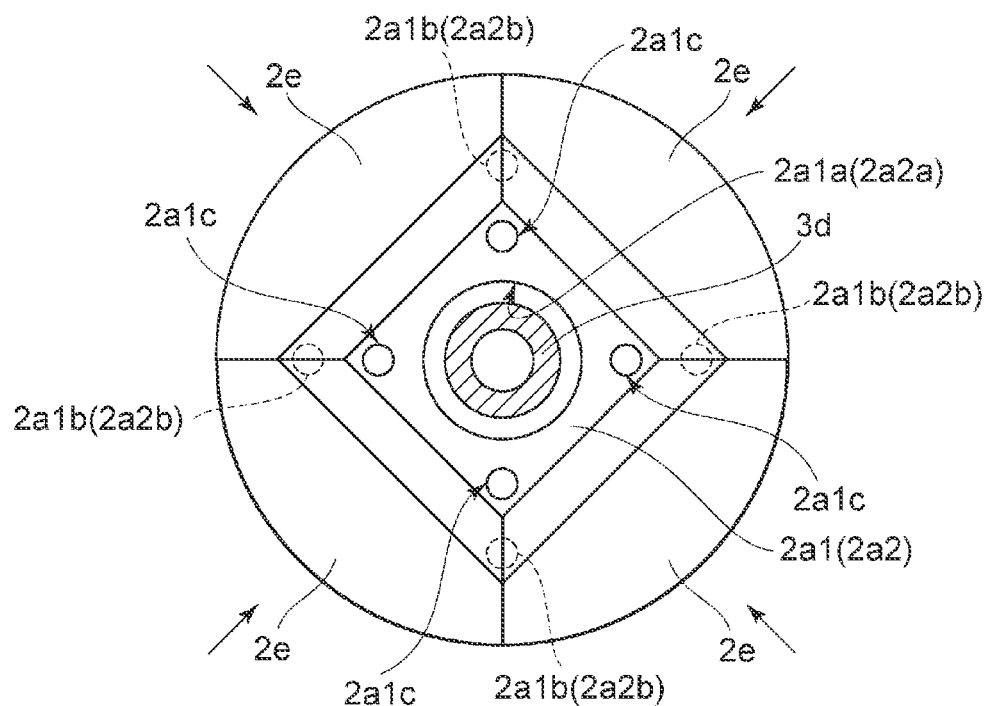
FIG. 3 is a schematic view of the placing unit in FIG. 1 taken along a line A-A.

FIG. 3 is a schematic view of the placing unit 2 in FIG. 1 taken along a line A-A.

FIGS. 1 to 3 illustrate a state where the substrate 100 is placed on the placing unit 2 (stage 2a), that is, a state where a freeze cleaning processing is performed on the substrate 100.

As illustrated in FIG. 1, the substrate apparatus 1 is provided with, for example, the placing unit 2, a cooling unit 3, a first liquid supply unit 4, a second liquid supply unit 5, a chamber 6, a blower unit 7, an exhaust unit 8, and a controller 9.

As illustrated in FIGS. 1 to 3, the placing unit 2 includes, for example, the stage 2a, a rotation shaft 2b, a driving unit 2c, a lift pin 2d, and a holding unit 2e.

The stage 2a is provided inside the chamber 6. The stage 2a is rotatable around a central axis.

The stage 2a includes, for example, a portion 2a1 (corresponding to an example of a second portion), and a portion 2a2 (corresponding to an example of a first portion) (see, FIG. 2).

The portion 2a1 has a plate shape. For example, the portion 2a1 has a disc shape. The portion 2a1 is provided on the portion 2a2. Further, an upper surface of the portion 2a1 is a flat surface, and corresponds to a surface of the stage 2a. A hole 2a1a (corresponding to an example of a first hole) penetrating in a thickness direction of the portion 2a1 is provided at a central portion of the portion 2a1. Further, a hole 2a1b penetrating in the thickness direction of the portion 2a1 is provided at a position in the portion 2a1 facing the lift pin 2d. Further, in an area of the portion 2a1 between the hole 2a1a and the hole 2a1b, a hole 2a1c (corresponding to an example of a second hole) that discharges a cooling gas 3a1 supplied to a space between the stage 2a (portion 2a1) and the substrate 100 is provided. The hole 2a1c penetrates the portion 2a1 in the thickness direction. At least one hole 2a1c may be provided. However, when a plurality of holes 2a1c is provided, the cooling gas 3a1 described above is easily discharged. Further, the plurality of holes 2a1c may be provided at positions point-symmetrical about the central axis of the stage 2a. In this manner, the exhaust may be performed uniformly with respect to the central axis of the stage 2a, and thus, it is possible to suppress the in-plane temperature of the substrate 100 from being ununiform.

Further, the hole 2a1c is provided around four corners of the substrate 100 placed on the stage 2a, and thus, the cooling gas 3a1 is finally discharged from around the four corners of the substrate 100 to the outside of the stage 2a. For this reason, a flow of the cooling gas 3a1 toward the four corners of the substrate 100 is generated between the substrate 100 and the stage 2a, and thus, the four corners of the substrate 100 are sufficiently cooled.

Further, a flow path 2a3 that discharges the cooling gas 3a1 to the outside of the stage 2a may be provided in a direction parallel with a direction toward the four corners of the substrate 100 (a direction of a line connecting the center of the hole 2a1c that discharges the cooling gas 3a1 and the center of the hole 2a1b).

The portion 2a2 has a plate shape. For example, the portion 2a2 has a disc shape. A hole 2a2a (corresponding to an example of a third hole) penetrating in a thickness direction of the portion 2a2 is provided at a central portion of the portion 2a2. The hole 2a2a may be provided concentrically with the hole 2a1a. Further, a hole 2a2b penetrating in the thickness direction of the portion 2a2 is provided at a position in the portion 2a2 facing the lift pin 2d. The hole 2a2b may be provided concentrically with the hole 2a1b.

The planar shape, planar dimension, and thickness of the portion 2a2 may be the same as the planar shape, planar dimension, and thickness of the portion 2a1, or at least one of them may be different from each other.

The flow path 2a3 that discharges the cooling gas 3a1 supplied to the space between the stage 2a (portion 2a1) and the substrate 100 to the outside of the stage 2a is provided between the portion 2a1 and the portion 2a2. For example, the flow path 2a3 is connected to the outside of the stage 2a. Further, for example, the flow path 2a3 is connected to a gap (corresponding to an example of a first gap) between the cooling nozzle 3d and the hole 2a1a and hole 2a2a. Further, the hole 2a1c is connected to the flow path 2a3 and the space between the stage 2a and the substrate 100.

As will be described later, a peripheral edge of the substrate 100 and the space between the stage 2a (portion 2a1) and the substrate 100 are surrounded by the holding unit 2e. For this reason, the cooling gas 3a1 supplied to the space between the stage 2a (portion 2a1) and the substrate 100 is discharged to the outside of the stage 2a through the hole 2a1c and the flow path 2a3. Further, the cooling gas 3a1 supplied to the space between the stage 2a (portion 2a1) and the substrate 100 is discharged to the outside of the stage 2a through the hole 2a1a and the flow path 2a3.

For example, the flow path 2a3 may be a groove. At least one groove may be provided. However, when a plurality of grooves (flow paths 2a3) is provided, the cooling gas 3a1 described above is easily discharged. Further, the plurality of grooves (holes 2a3) may be provided at positions point-symmetrical about the central axis of the stage 2a. In this manner, the exhaust may be performed uniformly with respect to the central axis of the stage 2a, and thus, it is possible to suppress the in-plane temperature of the substrate 100 from being ununiform. Further, the groove may be provided at least one of the portion 2a1 and the portion 2a2.

Further, a protrusion may be formed on at least one of a surface of the portion 2a1 facing the portion 2a2 and a surface of the portion 2a2 facing the portion 2a1, and the gap provided between the portion 2a1 and the portion 2a2 may be used as the flow path 2a3. In this manner, the cooling gas 3a1 is easily discharged, and further, the exhaust may be easily performed uniformly with respect to the central axis of the stage 2a. It is possible to further efficiently suppress the in-plane temperature of the substrate 100 from being ununiform.

As illustrated in FIG. 1, one end portion of the rotation shaft 2b is provided on a surface of the portion 2a2 opposite to the side of the portion 2a1. The other end portion of the rotation shaft 2b is provided outside the chamber 6. The rotation shaft 2b is connected to the driving unit 2c outside the chamber 6.

For example, the rotation shaft 2b has a cylindrical shape. The end portion of the rotation shaft 2b on the side of the stage 2a (portion 2a2) is opened.

The cooling nozzle 3d is attached to the end portion of the rotation shaft 2b on the opposite side to the side of the stage 2a. A rotation shaft seal (not illustrated) is provided between the end portion of the rotation shaft 2b on the opposite side to the side of the stage 2a and the cooling nozzle 3d. For this reason, the end portion of the rotation shaft 2b on the opposite side to the side of the stage 2a is air-tightly sealed.

The driving unit 2c is provided outside the chamber 6. The driving unit 2c is connected to the rotation shaft 2b. The driving unit 2c includes a rotating device such as a motor. The rotational force of the driving unit 2c is transmitted to the stage 2a via the rotation shaft 2b. For this reason, the stage 2a, and further, the substrate 100 held by a plurality of holding units 2e may be rotated by the driving unit 2c.

Further, the driving unit 2c may initiate and stop the rotation, and may change the number of rotations (rotational speed) as well. In this case, the driving unit 2c may include, for example, a control motor such as a servo motor.

The lift pin 2d has a bar shape, and a plurality of lift pins 2d may be provided. The lift pin 2d may be inserted into the hole 2a1b in the portion 2a1 and the hole 2a2b in the portion 2a2. The plurality of lift pins 2d are moved up and down by an elevating device (not illustrated). The plurality of lift pins 2d transfer the substrate 100 between the holding units 2e and a transfer device (not illustrated) (see FIG. 8).

The holding unit 2e holds the substrate 100. A plurality of holding units 2e is provided on a main surface on one side of the stage 2a (portion 2a1). For example, as illustrated in FIG. 3, the holding unit 2e may be provided for each side of the substrate 100. Each of the plurality of holding units 2e is movable in a direction toward the rotation shaft 2b along the surface of the stage 2a (portion 2a1). Further, each of the plurality of holding units 2e is movable in a direction away from the rotation shaft 2b (see FIG. 9).

For example, as illustrated in FIG. 3, when holding the substrate 100, each of the plurality of holding units 2e moves in a direction toward the central axis along the surface of the stage 2a (portion 2a1). The plurality of holding units 2e hold the substrate 100, and surround the peripheral edge of the substrate 100 and the space between the stage 2a (portion 2a1) and the substrate 100.

Further, when the substrate 100 is held by the plurality of holding units 2e, the substrate 100 is aligned in a direction parallel with the surface of the stage 2a (portion 2a1) and a direction perpendicular to the surface of the stage 2a (portion 2a1).

As illustrated in FIG. 3, when the plurality of holding units 2e hold the placed substrate 100, the outer dimension of the plurality of holding units 2e may be larger than the circumscribed circle including the corners of the substrate 100. Although the outline of the plurality of holding units 2e illustrated in FIG. 3 is a circle, the outline may be a polygon such as a quadrilateral or a hexagon.

Figure 4:
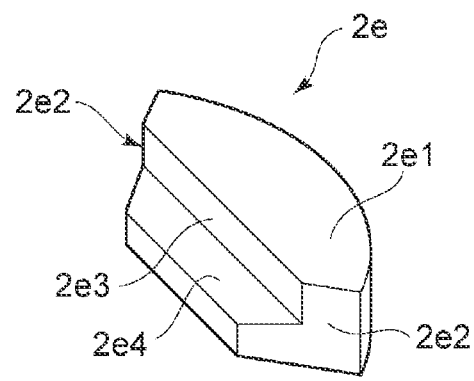
FIG. 4 is a schematic perspective view illustrating a holding unit.

FIG. 4 is a schematic perspective view illustrating the holding unit 2e.

As illustrated in FIG. 4, the holding unit 2e has a plate shape, and includes an upper surface 2e1, a side surface 2e2, an inner side surface 2e3, and an inclined surface 2e4.

The upper surface 2e1 is, for example, a flat surface substantially parallel with the surface of the stage 2a (portion 2a1). The length of the side of the upper surface 2e1 on the side of the substrate 100 (side of the inner side surface 2e3) is substantially the same as the length of the side of a surface 100b of the substrate 100. Further, when the plurality of holding units 2e hold the placed substrate 100, the distance between the upper surface 2e1 and the surface of the stage 2a (portion 2a1) is the same as the distance between the surface 100b of the substrate 100 and the surface of the stage 2a (portion 2a1). That is, when the plurality of holding units 2e hold the substrate 100, the upper surface 2e1 and the surface 100b of the substrate 100 are at the same height. The distance between the upper surface 2e1 and the surface of the stage 2a (portion 2a1) may be smaller than the distance between the surface 100b of the substrate 100 and the surface of the stage 2a (portion 2a1) by 0.1 mm.

For this reason, as illustrated in FIGS. 1 to 3, when the plurality of holding units 2e hold the placed substrate 100, a flat surface that surrounds the periphery of the substrate 100, and further, is substantially flush with the surface 100b of the substrate 100 is formed. In this manner, in a thawing process (to be described later), a liquid 101 and a frozen liquid 101 may be smoothly discharged from the surface 100b of the substrate 100.

As illustrated in FIG. 4, the side surface 2e2 is connected to the upper surface 2e1. The side surface 2e2 is, for example, a flat surface substantially perpendicular to the surface of the stage 2a (portion 2a1). As illustrated in FIG. 3, when the plurality of holding units 2e hold the placed substrate 100, the side surfaces 2e2 of the adjacent holding units 2e are in contact with each other.

The inner side surface 2e3 is connected to the upper surface 2e1 and the side surface 2e2. The inner side surface 2e3 faces the side surface of the substrate 100. The inner side surface 2e3 is, for example, a flat surface substantially perpendicular to the surface of the stage 2a (portion 2a1). As illustrated in FIGS. 1 to 3, when the plurality of holding units 2e hold the placed substrate 100, the inner side surfaces 2e3 is in contact with the side surface of the substrate 100.

For this reason, as illustrated in FIGS. 1 to 3, when the plurality of holding units 2e hold the placed substrate 100, the space between the stage 2a (portion 2a1) and the substrate 100 is closed by the plurality of holding units 2e. In this manner, the cooling gas 3a1 flowing in the space between the stage 2a (portion 2a1) and the substrate 100 may be suppressed from flowing to the outside of the substrate 100.

Here, in a preliminary process, a cooling process, and the thawing process (to be described later), the liquid 101 supplied to the surface 100b of the substrate 100 and the cooling gas 3a1 supplied to the space between the stage 2a (portion 2a1) and the substrate 100 intersect in the vicinity of the peripheral edge of the substrate 100. Then, the stage 2a or members provided in the vicinity of the stage 2a may be frozen around the substrate 100. The vicinity of the peripheral edge of the substrate 100 includes an outer periphery of a back surface 100a of the substrate 100 as well. That is, the liquid 101 may be flown around the outer periphery of the back surface 100a of the substrate 100. The liquid 101 flown around the back surface 100a of the substrate 100 may contain contaminants, and thus, the back surface 100a of the substrate 100 may be contaminated.

Further, when the cooling gas 3a1 flows to the outside of the substrate 100, due to the moisture contained in the atmosphere in which the freeze cleaning processing is performed, frost may be generated in the vicinity of the peripheral edge of the substrate 100 or the members provided in the vicinity of the stage 2a.

When these unnecessary freezing occurs around the substrate 100, the substrate processing apparatus 1 may malfunction or the effect of the freeze cleaning processing may be reduced.

According to the holding unit 2e according to the present embodiment, the cooling gas 3a1 may be suppressed from flowing to the outside of the substrate 100, and thus, the occurrence of unnecessary freezing around the substrate 100 may be suppressed. Further, the freezing on the back surface 100*a* of the substrate 100 may be suppressed as well.

As illustrated in FIG. 4, the inclined surface 2*e*4 is connected to the inner side surface 2*e*3 and the side surface 2*e*2. The inclined surface 2*e*4 is positioned below the back surface 100*a* of the substrate 100. The inclined surface 2*e*4 is inclined with respect to the surface (back surface 100*a* of the substrate 100) of the stage 2*a* (portion 2*a*1). The distance between the inclined surface 2*e*4 and the surface of the stage 2*a* (portion 2*a*1) is gradually increased as it goes to the side of the inner side surface 2*e*3.

When the substrate 100 is held by the plurality of holding units 2*e*, the edge of the back surface 100*a* of the substrate 100 is brought into contact with the inclined surface 2*e*4. For this reason, the holding unit 2*e* may be in line contact with the edge of the back surface 100*a* of the substrate 100. When the holding unit 2*e* and the edge of the back surface 100*a* of the substrate 100 are in line contact, the substrate 100 may be suppressed from being soiled or damaged.

Further, the edge of the back surface 100*a* of the substrate 100 may be chamfered. In this case, the portion that is chamfered is brought into contact with the inclined surface 2*e*4. For this reason, the back surface 100*a* of the substrate 100 may be suppressed from being brought into contact with the holding unit 2*e*, and thus, the back surface 100*a* of the substrate 100 may be further suppressed from being soiled or damaged.

Further, the inclined surface 2*e*4 of the holding unit 2*e* may be formed in a comb shape like a blade of a hair clipper. Alternatively, a plurality of grooves may be formed on the inclined surface 2*e*4 of the holding unit 2*e* toward the outer peripheral direction of the holding unit 2*e*. In this manner, the portion that is in contact with the substrate 100 may be reduced. Further, the cooling gas 3*a*1 easily reaches the end of the substrate 100.

The surface of the holding unit 2*e* may have a liquid repellency with respect to liquids 101 and 102. When the surface of the holding unit 2*e* has the liquid repellency, the liquids 101 and 102 may be suppressed from remaining on the surface of the holding unit 2*e*. For this reason, the remaining liquids 101 and 102 are frozen, and thus, it is possible to suppress the movement of the holding unit 2*e* from being hindered or the discharge of the liquids 101 and 102 from being hindered.

For example, the holding unit 2*e* may be made using a material with high repellency, or a film containing a material with high repellency may be formed on the surface of the holding unit 2*e*. The material with high repellency may be, for example, a material having a functional group such as a saturated fluoroalkyl group such as a trifluromethyl group, a fluorosilyl group, an alkylsilyl group, or a long-chain alkyl group. For example, the holding unit 2*e* may contain fluororesin. For example, in the holding unit 2*e*, a film containing fluororesin may be formed on the surface of a base portion containing metal such as stainless steel.

Further, the surface of the holding unit 2*e* may have a fractal structure. The fractal structure may be formed by, for example, etching the surface of the holding unit 2*e* using plasma or a corrosive liquid. The surface of the film containing the material containing the functional groups described above may have the fractal structure.

Further, at least a portion of the holding unit 2*e* that holds the substrate 100 may be covered with a resin having a high thermal conductivity. For example, the side surface 2*e*2, inner side surface 2*e*3, and inclined surface 2*e*4 of the holding unit 2*e* may be covered with a resin having a high thermal conductivity.

The inner side surface 2*e*3 and the inclined surface 2*e*4 are brought into contact with the substrate 100. The side surfaces 2*e*2 of the adjacent holding units 2*e* are in contact with each other. For this reason, when the side surface 2*e*2, inner side surface 2*e*3, and inclined surface 2*e*4 are covered with the resin, it is possible to suppress the side surface 2*e*2, inner side surface 2*e*3, and inclined surface 2*e*4 from being damaged.

Further, when the side surface 2*e*2, inner side surface 2*e*3, and inclined surface 2*e*4 are covered with the resin having a high thermal conductivity, it is possible to improve the responsiveness to a temperature change. For this reason, it is possible to suppress the heat of the substrate 100 from escaping to the holding unit 2*e* in the preliminary process or the cooling process (to be described later).

Next, referring back to FIG. 1, other components provided in the substrate processing apparatus 1 will be described.

As illustrated in FIG. 1, the cooling unit 3 supplies the cooling gas 3*a*1 to the space between the stage 2*a* (portion 2*a*1) and the back surface 100*a* of the substrate 100. The cooling unit 3 includes a cooling liquid unit 3*a*, a filter 3*b*, a flow rate control unit 3*c*, and the cooling nozzle 3*d*. The cooling liquid unit 3*a*, filter 3*b*, and flow rate control unit 3*c* are provided outside the chamber 6.

The cooling liquid unit 3*a* accommodates a cooling liquid and generates the cooling gas 3*a*1. The cooling liquid is obtained by liquefying the cooling gas 3*a*1. The cooling gas 3*a*1 is not particularly limited as long as it is less likely to react with the material of the substrate 100. The cooling gas 3*a*1 may be, for example, an inert gas such as a nitrogen gas, helium gas, or argon gas.

The cooling liquid unit 3*a* includes a tank in which the cooling liquid is accommodated, and a vaporization portion that vaporizes the cooling liquid accommodated in the tank. The tank is provided with a cooling device that maintains the temperature of the cooling liquid. The vaporization portion generates the cooling gas 3*a*1 from the cooling liquid by raising the temperature of the cooling liquid. For example, the vaporization portion may use the temperature of the outside air, or heating by a heat medium. The temperature of the cooling gas 3*a*1 may be a temperature of the freezing point of the liquid 101 or less.

Although the case where the cooling liquid unit 3*a* evaporates the cooling liquid accommodated in the tank to generate the cooling gas 3*a*1 is illustrated, the inert gas may be cooled by a chiller to generate the cooling gas 3*a*1. In this manner, the cooling liquid portion may be simplified.

The filter 3*b* is connected to the cooling liquid unit 3*a* via a pipe. The filter 3*b* suppresses contaminants such as particles contained in the cooling liquid from flowing out to the side of the substrate 100.

The flow rate control unit 3*c* is connected to the filter 3*b* via a pipe. The flow rate control unit 3*c* controls a flow rate of the cooling gas 3*a*1. The flow rate control unit 3*c* may be, for example, a mass flow controller (MFC). Further, the flow rate control unit 3*c* may indirectly control the flow rate of the cooling gas 3*a*1 by controlling a supply pressure of the cooling gas 3*a*1. In this case, the flow rate control unit 3*c* may be, for example, an auto pressure controller (APC).

The temperature of the cooling gas 3*a*1 generated from the cooling liquid of the cooling liquid unit 3*a* is substantially a predetermined temperature. For this reason, by controlling the flow rate of the cooling gas 3*a*1 by the flow rate control unit 3c, the temperature of the substrate 100, and further, the temperature of the liquid 101 on the surface 100b of the substrate 100 may be controlled. In this case, by controlling the flow rate of the cooling gas 3a1 by the flow rate control unit 3c, a supercooled state of the liquid 101 may occur in a supercooling process (to be described later).

The cooling nozzle 3d has a cylindrical shape. The cooling nozzle 3d supplies the cooling gas 3a1 at the flow rate controlled by the flow rate control unit 3c to the space between the stage 2a (portion 2a1) and the substrate 100. The cooling gas 3a1 supplied to the space between the stage 2a (portion 2a1) and the substrate 100 may be directly supplied to the back surface 100a of the substrate 100.

The cooling nozzle 3d is inserted into the inside of the rotation shaft 2b. One end portion of the cooling nozzle 3d is provided outside the rotation shaft 2b, and is connected to the flow rate control unit 3c. As described above, the stage 2a (portion 2a1 and portion 2a2) is rotated. Meanwhile, the cooling nozzle 3d is fixed to the chamber 6 or the like. For this reason, as illustrated in FIG. 2, the other end portion of the cooling nozzle 3d is provided in the hole 2a1a of the portion 2a1 and the hole 2a2a of the portion 2a2 with a gap (corresponding to an example of the first gap) therebetween.

However, when the gap is provided between the cooling nozzle 3d and an inner wall of the hole 2a1a and an inner wall of the hole 2a2a, the cooling gas 3a1 may enter the inside of the rotation shaft 2b through this gap. When the cooling gas 3a1 enters the inside of the rotation shaft 2b, freezing may occur between the rotation shaft 2b and cooling nozzle 3d. When the freezing occurs on this portion, the rotation of the stage 2a may be hindered, or the substrate processing apparatus 1 may malfunction.

For this reason, as illustrated in FIG. 2, a seal portion 3d1 is provided in the vicinity of the end portion of the cooling nozzle 3d.

The seal portion 3d1 includes, for example, a base portion 3d1a, and a convex portion 3d1b.

The base portion 3d1a has a plate shape, and is provided on an outer surface of the cooling nozzle 3d. For example, the base portion 3d1a has a disc shape, and protrudes in a direction substantially perpendicular to a central axis of the cooling nozzle 3d.

The convex portion 3d1b has an annular shape, and is provided in the vicinity of a peripheral edge of the base portion 3d1a. The convex portion 3d1b protrudes, for example, in a direction substantially parallel with the central axis of the cooling nozzle 3d.

A groove 2a2c (corresponding to an example of a first groove) is provided in the inner wall of the hole 2a2a of the portion 2a2. The vicinity of the peripheral edge of the base portion 3d1a, and the convex portion 3d1b are provided in the groove 2a2c with a gap (corresponding to an example of a second gap) therebetween. The gap between the seal portion 3d1 and the groove 2a2c is smaller than the gap between the cooling nozzle 3d and the inner wall of the hole 2a2a. For this reason, since the cooling gas 3a1 is less likely to flow through the gap between the seal portion 3d1 and the groove 2a2c, it is possible to suppress the cooling gas 3a1 from entering the inside of the rotation shaft 2b.

Figure 5:
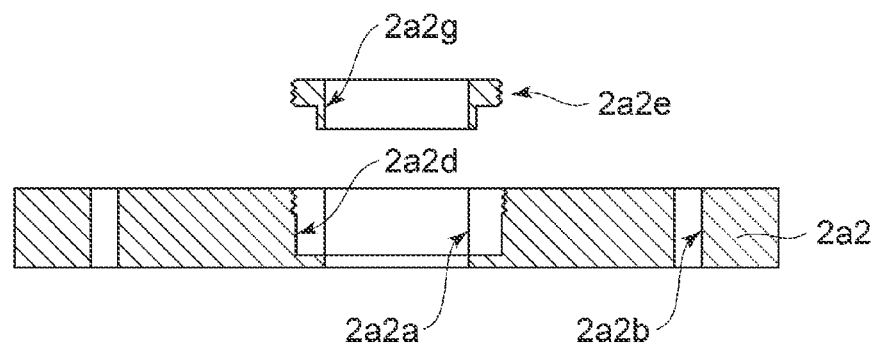
FIG. 5 is a schematic exploded view illustrating formation of a groove.

FIG. 5 is a schematic exploded view illustrating formation of the groove 2a2c.

As illustrated in FIG. 5, a recess portion 2a2d opened to the inner wall of the hole 2a2a of the portion 2a2 and the surface of the portion 2a on the side of the portion 2a1 may be provided. Then, the groove 2a2c may be formed by adhering a piece 2a2e to an inner wall of the recess portion 2a2d.

Figure 6:
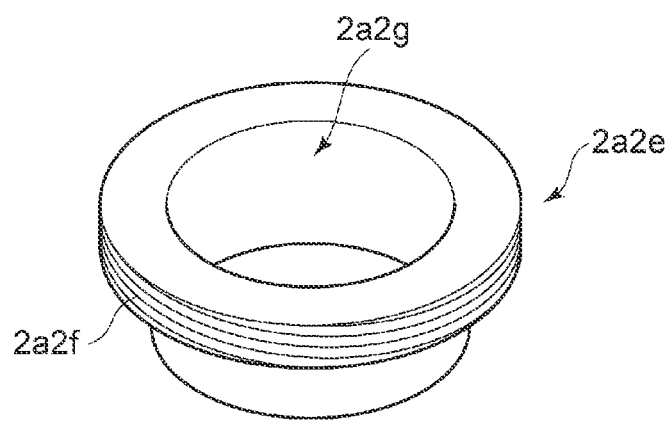
FIG. 6 is a schematic perspective view illustrating a piece.

FIG. 6 is a schematic perspective view illustrating the piece 2a2e.

As illustrated in FIG. 6, an enlarged diameter portion 2a2f may be provided on a side of one end portion of the piece 2a2e. A male screw may be provided on the side surface of the enlarged diameter portion 2a2f, and a female screw may be provided on the inner wall of the recess portion 2a2d.

Further, a hole 2a2g penetrating in a central axis direction may be provided in the piece 2a2e. The diameter dimension of the hole 2a2g of the piece 2a2e may be the same as the diameter dimension of the hole 2a2a of the portion 2a2.

When the groove 2a2c is formed by adhering the piece 2a2e to the inner wall of the recess portion 2a2d, the groove 2a2c is easily formed. Further, the portion 2a2 and the cooling nozzle 3d are easily assembled.

As illustrated in FIG. 1, the first liquid supply unit 4 supplies the liquid 101 to the surface 100b of the substrate 100. In a freezing process (to be described later), when the liquid 101 is changed from liquid to solid (liquid-solid phase change), the volume is changed and a pressure wave is generated. It is considered that the contaminants attached to the surface 100b of the substrate 100 are separated due to the pressure wave. For this reason, the liquid 101 is not particularly limited as long as it is a liquid that is less likely to react with the material of the substrate 100.

When a liquid with the volume increased when frozen is used as the liquid 101, it is considered that the contaminants attached to the surface of the substrate 100 may be separated by using a physical force that caused by the increase in volume. For this reason, the liquid 101 may be a liquid, which is less likely to react with the material of the substrate 100, and further, with the volume increased when frozen. For example, the liquid 101 may be water (e.g., pure water or ultrapure water), or a liquid containing water as a main component.

In a case where the liquid containing water as a main component is used, when there are too many components other than water, it becomes difficult to use the physical force caused by the increase in volume, and thus, the removal rate of the contaminants may be decreased. For this reason, the concentration of the components other than water may be 5 wt % or more and 30 wt % or less.

Further, a gas may be dissolved in the liquid 101. For example, the gas may be carbon dioxide gas, ozone gas, or hydrogen gas.

The first liquid supply unit 4 includes, for example, a liquid accommodating unit 4a, a supply unit 4b, a flow rate control unit 4c, and a liquid nozzle 4d. The liquid accommodating unit 4a, supply unit 4b, and flow rate control unit 4c are provided outside the chamber 6.

The liquid accommodating unit 4a accommodates the liquid 101 described above.

The supply unit 4b is connected to the liquid accommodating unit 4a via a pipe. The supply unit 4b supplies the liquid 101 accommodated in the liquid accommodating unit 4a toward the liquid nozzle 4d. The supply unit 4b may be, for example, a pump that is resistant with respect to the liquid 101. The case where the supply unit 4b is a pump is illustrated, but the supply unit 4b is not limited to a pump. For example, the supply unit 4b may supply a gas to the inside of the liquid accommodating unit 4a to pressure-feed the liquid 101 accommodated in the liquid accommodating unit 4a.

The flow rate control unit 4c is connected to the supply unit 4b via a pipe. The flow rate control unit 4c controls the flow rate of the liquid 101 supplied by the supply unit 4b. The flow rate control unit 4c may be, for example, a flow rate control valve. Further, the flow rate control unit 4c may initiate and stop the supply of the liquid 101.

The liquid nozzle 4d is provided inside the chamber 6. The liquid nozzle 4d has a cylindrical shape. One end portion of the liquid nozzle 4d is connected to the flow rate control unit 4c via a pipe. The other end portion of the liquid nozzle 4d faces the surface 100b of the substrate 100 placed on the stage 2a. For this reason, the liquid 101 ejected from the liquid nozzle 4d is supplied to the surface 100b of the substrate 100.

Further, the other end portion of the liquid nozzle 4d (ejection port for the liquid 101) is positioned substantially at the center of the surface 100b of the substrate 100. The liquid 101 ejected from the liquid nozzle 4d spreads from substantially the center of the surface 100b of the substrate 100, so that a liquid film having a substantially constant thickness is formed on the surface 100b of the substrate 100.

The second liquid supply unit 5 supplies the liquid 102 to the surface 100b of the substrate 100. The second liquid supply unit 5 includes a liquid accommodating unit 5a, a supply unit 5b, a flow rate control unit 5c, and the liquid nozzle 4d.

The liquid 102 may be used in the thawing process (to be described later). For this reason, the liquid 102 is not particularly limited as long as it is a liquid that is less likely to react with the material of the substrate 100, and further, is less likely to remain on the surface 100b of the substrate 100 in a drying process (to be described later). For example, the liquid 102 may be water (e.g., pure water or ultrapure water), or a liquid containing water as a main component.

The liquid accommodating unit 5a may be the same as the liquid accommodating unit 4a described above. The supply unit 5b may be the same as the supply unit 4b described above. The flow rate control unit 5c may be the same as the flow rate control unit 4c described above.

When the liquid 102 and the liquid 101 are the same, the second liquid supply unit 5 may be omitted. Further, although the case where the liquid nozzle 4d is shared is illustrated, a liquid nozzle that ejects the liquid 101 and a liquid nozzle that ejects the liquid 102 may be provided separately.

Further, the temperature of the liquid 102 may be higher than the freezing point of the liquid 101. Further, the temperature of the liquid 102 may be a temperature capable of thawing the frozen liquid 101. The temperature of the liquid 102 may be, for example, a room temperature (20° C.).

When the second liquid supply unit 5 is omitted, the temperature of the liquid 101 may be higher than the freezing point of the liquid 101. Further, the temperature of the liquid 101 may be a temperature capable of thawing the frozen liquid 101. The temperature of the liquid 101 may be, for example, a room temperature (20° C.).

The chamber 6 has a box shape. A cover 6a is provided inside the chamber 6. The cover 6a receives the liquids 101 and 102 that are supplied to the substrate 100, and then discharged to the outside of the substrate 100 as the substrate 100 rotates. The cover 6a has a cylindrical shape. The vicinity of the end portion of the cover 6a (the vicinity of the upper end of the cover 6a) on the opposite side to the side of the stage 2a is bent toward the center of the cover 6a. For this reason, the liquids 101 and 102 splashing above the substrate 100 may be easily captured.

Further, a partition plate 6b is provided inside the chamber 6. The partition plate 6b is provided between an outer surface of the cover 6a and an inner surface of the chamber 6.

A plurality of discharge ports 6c is provided on the side surface of a bottom surface side of the chamber 6. In the case of FIG. 1, two discharge ports 6c are provided. The used cooling gas 3a1, air 7a, liquid 101, and liquid 102 are discharged from the discharge port 6c to the outside of the chamber 6. An exhaust pipe 6c1 is connected to the discharge port 6c. Further, a discharge pipe 6c2 that discharges the liquids 101 and 102 is connected to the discharge port 6c.

The discharge port 6c is provided below the substrate 100. For this reason, the cooling gas 3a1 is exhausted from the discharge port 6c, and thus, a downflow flow is generated. As a result, soaring of the particles may be prevented.

In plan view, the plurality of discharge ports 6c are provided symmetrically with respect to the center of the chamber 6. In this manner, the exhaust direction of the cooling gas 3a1 becomes symmetrical with respect to the center of the chamber 6. When the exhaust direction of the cooling gas 3a1 becomes symmetrical, the cooling gas 3a1 is exhausted smoothly.

The blower unit 7 is provided on a ceiling surface of the chamber 6. The blower unit 7 may be provided on the side surface of the chamber as well 6 as long as the side surface is on the ceiling side. The blower unit 7 may include a blowing device such as a fan and a filter. The filter may be, for example, a high efficiency particulate air (HEPA) filter.

The blower unit 7 supplies the air 7a (outside air) to a space between the partition plate 6b and the ceiling of the chamber 6. For this reason, the pressure of the space between the partition plate 6b and the chamber 6 becomes higher than the pressure of the outside. As a result, the air 7a supplied by the blower unit 7 may be easily induced to the discharge port 6c. Further, it may be possible to suppress the contaminants such as particles from entering the inside of the chamber 6 from the discharge port 6c.

The exhaust unit 8 is connected to the exhaust pipe 6c1. The exhaust unit 8 exhausts the used cooling gas 3a1 and the air 7a. The exhaust unit 8 may be a pump or a blower.

The controller 9 controls an operation of each component provided in the substrate processing apparatus 1. The controller 9 includes, for example, a processing unit such as a central processing unit (CPU) and a storage unit such as a semiconductor memory. The controller 9 may be, for example, a computer. The storage unit may store a control program that controls the operation of each component provided in the substrate processing apparatus 1. The processing unit controls the operation of each component provided in the substrate processing apparatus 1 using the control program stored in the storage unit or data input by an operator.

Next, an operation of the substrate processing apparatus 1 will be illustrated.

Figure 7:
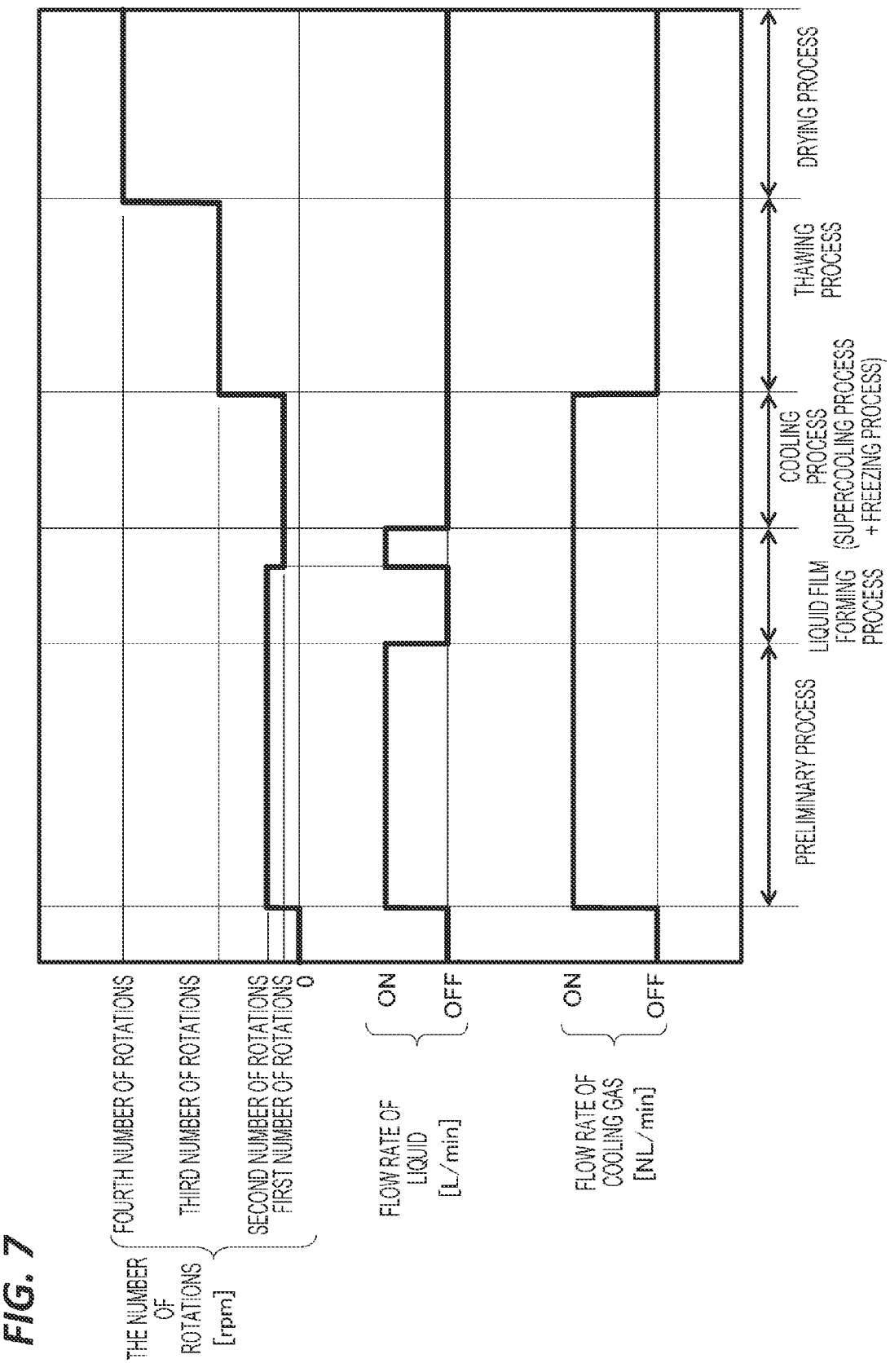
FIG. 7 is a timing chart illustrating an operation of the substrate processing apparatus.

FIG. 7 is a timing chart illustrating the operation of the substrate processing apparatus 1.

FIG. 7 illustrates a case where the substrate 100 is a 6025 quartz (Qz) substrate (152 mm×152 mm×6.35 mm), and the liquid 101 and liquid 102 are pure water.

First, the substrate 100 is carried into the inside of the chamber 6 through a carry-in/out port (not illustrated) of the chamber 6. The substrate 100, which is carried in, is placed on the plurality of holding units 2e, and the substrate 100 is held and aligned by the plurality of holding units 2e.

Figure 8:
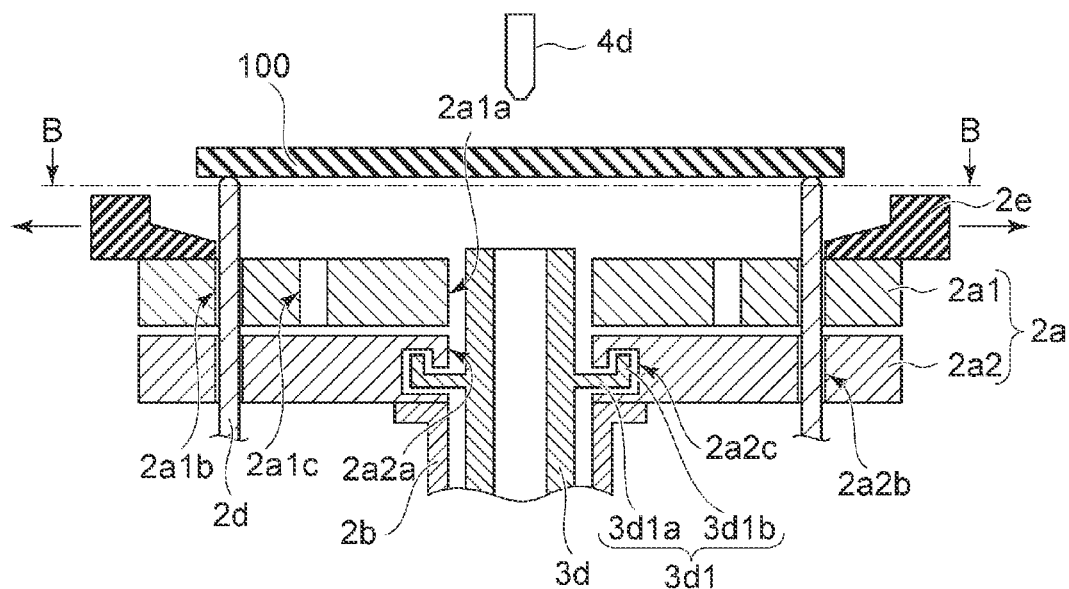
FIG. 8 is a schematic cross-sectional view illustrating transfer of a substrate.

FIG. 8 is a schematic cross-sectional view illustrating transfer of the substrate 100.

Figure 9:
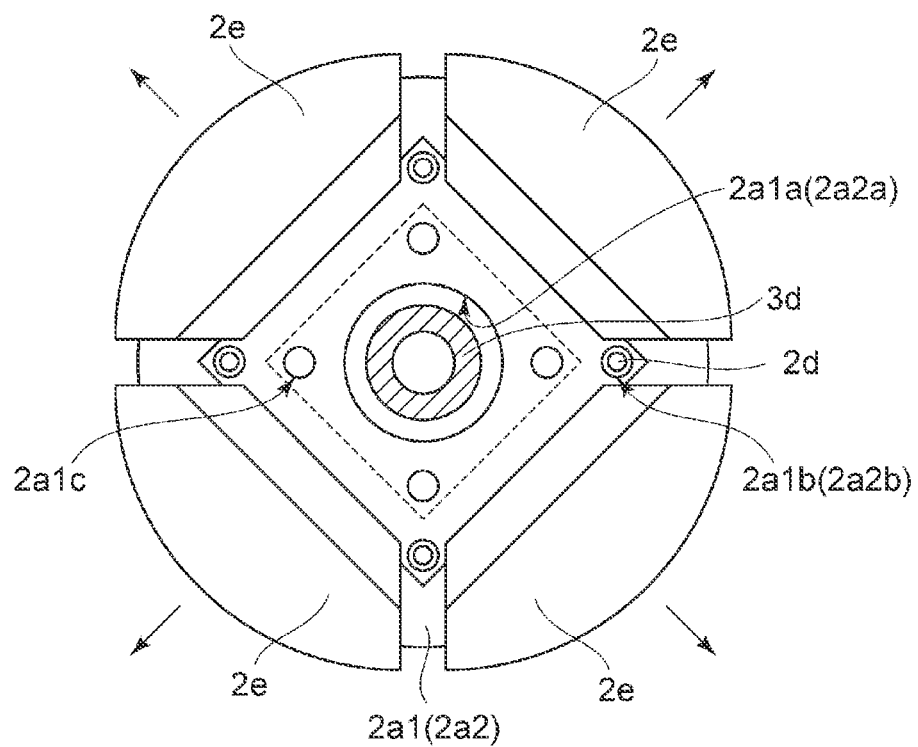
FIG. 9 is a schematic view of the placing unit in FIG. 8 taken along a line B-B.

FIG. 9 is a schematic view of the placing unit 2 in FIG. 8 taken along a line B-B.

For example, when receiving the substrate 100 before the processing from the transfer device (not illustrated), as illustrated in FIGS. 8 and 9, the plurality of holding units 2e are moved in a direction away from the rotation shaft 2b. Then, as illustrated in FIG. 8, a tip end of the lift pin 2d is moved above the stage 2a (portion 2a1) by an elevation device (not illustrated) to receive the substrate 100 before the processing from the transfer device (not illustrated). Next, the lift pin 2d is lowered by the elevation device (not illustrated) to transfer the substrate 100 before the processing to the holding units 2e. In this case, as illustrated in FIGS. 1 and 2, the tip end of the lift pin 2d is positioned below the stage 2a (portion 2a2) at the lowered end. In this manner, it is possible to rotate the stage 2a. Next, as illustrated in FIGS. 2 and 3, the plurality of holding units 2e are moved toward the rotation shaft 2b. Then, the substrate 100 is held and aligned by the plurality of holding units 2e.

After the substrate 100 is held by the plurality of holding units 2e, as illustrated in FIG. 7, a freeze cleaning process including the preliminary process, a liquid film forming process, the cooling process (supercooling process+freezing process), the thawing process, and the drying process is performed.

First, as illustrated in FIG. 7, the preliminary process is performed. In the preliminary process, the controller 9 controls the supply unit 4b and the flow rate control unit 4c so as to supply the liquid 101 at a predetermined flow rate to the surface 100b of the substrate 100. Further, the controller 9 controls the flow rate control unit 3c so as to supply the cooling gas 3a1 at a predetermined flow rate to the back surface 100a of the substrate 100. Further, the controller 9 controls the driving unit 2c so as to rotate the substrate 100 at a predetermined number of rotations (second number of rotations).

In this case, the liquid 101 is continuously supplied to the rotating substrate 100.

Here, when the atmosphere inside the chamber 6 is cooled by the supply of the cooling gas 3a1 by the cooling unit 3, frost containing dusts in the air may adhere to the substrate 100, which may cause contamination. In the preliminary process, the liquid 101 is continuously supplied to the surface 100b of the substrate 100, and thus, it is possible to prevent frost from adhering to the surface 100b of the substrate 100 while uniformly cooling the substrate 100.

For example, in the case illustrated in FIG. 7, for example, the second number of rotations may be set to approximately 50 rpm to 500 rpm, the flow rate of the liquid 101 may be set to approximately 0.1 L/min to 1 L/min, the flow rate of the cooling gas 3a1 may be set to approximately 40 NL/min to 200 NL/min, and a process time of the preliminary process may be set to approximately 1,800 second. The process time of the preliminary process may be a time required for the in-plane temperature of the substrate 100 to be substantially uniform. These conditions may be obtained by performing an experiment or a simulation in advance.

Since the liquid 101 is continuously supplied, the temperature of the liquid 101 on the surface 100b of the substrate 100 in the preliminary process becomes substantially the same as the temperature of the supplied liquid 101. For example, when the temperature of the supplied liquid 101 is approximately a room temperature (20° C.), the temperature of the liquid 101 (hereinafter, referred to as a liquid film) that exists on the surface 100b of the substrate 100 becomes approximately the room temperature (20° C.).

Next, as illustrated in FIG. 7, the liquid film forming process is performed. In the liquid forming process, the supply of the liquid 101 that is supplied during the preliminary process is stopped. In this case, since the rotation of the substrate 100 is maintained, the liquid 101 on the surface 100b of the substrate 100 is discharged. Then, the number of rotations of the substrate 100 is reduced to a first number of rotations, which is smaller than the second number of rotations. The first number of rotations may be set to, for example, a range of 0 rpm to 50 rpm. After setting the number of rotations of the substrate 100 to the first number of rotations, a predetermined amount of the liquid 101 is supplied to the substrate 100 to form a liquid film. The supply of the cooling gas 3a1 is maintained.

The thickness (thickness of the liquid film when performing the supercooling process) of the liquid film formed in the liquid film forming process may be set to approximately 200 μm to 1,300 μm. For example, the controller 9 controls the supply amount of the liquid 101 so that the thickness of the liquid film on the surface 100b of the substrate 100 is set to approximately 200 μm to 1,300 μm.

Next, as illustrated in FIG. 7, the cooling process (supercooling process+freezing process) is performed. In the present embodiment, during the cooling process, the process in which the liquid 101 becomes a supercooled state and then the freezing is started is referred to as the "supercooling process", and the process in which the liquid 101 in the supercooled state becomes a frozen state and thawing is started by the thawing process is referred to as the "freezing process."

Here, when the cooling speed of the liquid 101 is too fast, the liquid 101 will not become the supercooled state, but will freeze immediately. For this reason, the controller 9 controls at least one of the flow rate of the cooling gas 3a1 and the number of rotations of the substrate 100 so that the liquid 101 on the surface 100b of the substrate 100 becomes the supercooled state.

The conditions under which the liquid 101 becomes the supercooled state are affected by the size of the substrate 100, the viscosity of the liquid 101, and the specific heat of the cooling gas 3a1. For this reason, the conditions under which the liquid 101 becomes the supercooled state may be appropriately determined by performing an experiment or a simulation.

As illustrated in FIG. 7, in the cooling process (supercooling process+freezing process), the flow rate of the cooling gas 3a1 and the number of rotations are the same as those in the liquid film forming process. Due to the cooling gas 3a1 continuously supplied to the back surface 100a of the substrate 100, the temperature of the liquid film on the substrate 100 is further lowered than the temperature of the liquid film in the liquid film forming process, resulting in the supercooled state.

In the supercooled state, for example, the freezing of the liquid 101 is initiated due to, for example, the temperature of the liquid, the presence of the contaminants such as particles, and the vibration. For example, when the contaminants such as particles exist, the freezing of the liquid 101 is initiated when the temperature of the liquid 101 becomes approximately −20° C. to −35° C.

When the freezing of the liquid 101 in the supercooled state is initiated, the process is transitioned from the supercooling process to the freezing process. In the freezing process, at least a part of the liquid film on the surface 100b of the substrate 100 is frozen. In the freeze cleaning process according to the present embodiment, a case where the liquid film is completely frozen to form an ice film will be described.

Next, as illustrated in FIG. 7, the thawing process is performed. FIG. 7 illustrates the case where the liquid 101 and the liquid 102 are the same liquid. For this reason, the liquid 101 is indicated in FIG. 7. In the thawing process, the controller 9 controls the supply unit 4b and the flow rate control unit 4c so as to supply the liquid 101 at a predetermined flow rate to the surface 100b of the substrate 100. When the liquid 101 and the liquid 102 are different from each other, the controller 9 controls the supply unit 5b and the flow rate control unit 5c so as to supply the liquid 102 at a predetermined flow rate to the surface 100b of the substrate 100.

Further, the controller 9 controls the flow rate control unit 3c to stop the supply of the cooling gas 3a1. Therefore, the thawing of the ice film is started, and the ice film gradually becomes the liquid 101. Further, the controller 9 controls the driving unit 2c so as to increase the number of rotations of the substrate 100 to a third number of rotations, which is larger than the second number of rotations. When the rotation of the substrate 100 becomes faster, the liquid 101 and the melted residues of the ice film may be shaken off by centrifugal force. For this reason, the liquid 101 and the melted residues of the ice film may be discharged from the surface 100b of the substrate 100. At this time, the contaminants separated from the surface 100b of the substrate 100 are discharged together with the liquid 101 and the melted residues of the ice film.

The supply amount of the liquid 101 or the liquid 102 is not particularly limited as long as the thawing can be performed by the liquid 101 or the liquid 102. Further, the third number of rotations is not particularly limited as long as the liquid 101, the melted residues of the ice film, and the contaminants can be discharged.

Next, as illustrated in FIG. 7, the drying process is performed. In the drying process, the controller 9 controls the supply unit 4b and the flow rate control unit 4c to stop the supply of the liquid 101. When the liquid 101 and the liquid 102 are different from each other, the controller 9 controls the supply unit 5b and the flow rate control unit 5c so as to stop the supply of the liquid 102.

Further, the controller 9 controls the driving unit 2c so as to set the number of rotations of the substrate 100 to a fourth number of rotations, which is larger than the third number of rotations. When the rotation of the substrate 100 becomes faster, the drying of the substrate 100 may be quickly performed. The fourth number of rotations is not particularly limited as long as the drying can be performed.

In the manner described above, the substrate 100 may be processed (removal of contaminants).

Next, the substrate 100 after the processing, which is held by the plurality of holding units 2e is transferred to the transfer device (not illustrated). The transfer device (not illustrated) carries out the substrate 100 after the process to the outside of the chamber 6.

For example, as illustrated in FIGS. 8 and 9, the plurality of holding units 2e are moved in a direction away from the rotation shaft 2b. Then, as illustrated in FIG. 8, the tip end of the lift pin 2d is moved above the stage 2a (portion 2a1) by the elevation device (not illustrated) to receive the substrate 100 after the processing from the plurality of holding units 2e, and the received substrate 100 after the processing is transferred to the transfer device (not illustrated). Thereafter, as illustrated in FIGS. 1 and 2, the lift pin 2d is lowered to the lowered end.

Thereafter, the procedures described above are repeated to perform the freeze cleaning processing of a plurality of substrates 100.

Figure 10:
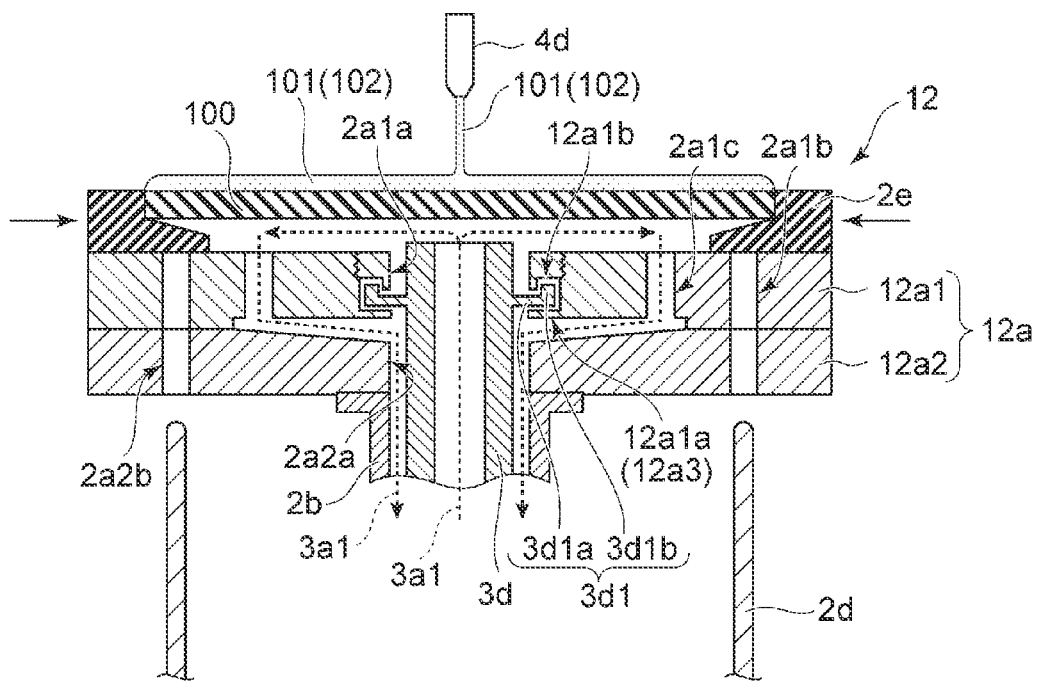
FIG. 10 is a schematic cross-sectional view illustrating a placing unit according to another embodiment.

FIG. 10 is a schematic cross-sectional view illustrating a placing unit 12 according to another embodiment.

As illustrated in FIG. 10, the placing unit 12 includes a stage 12a, the rotation shaft 2b, the driving unit 2c, the lift pin 2d, and the holding units 2e.

In FIG. 10, the driving unit 2c is omitted.

The stage 12a includes, for example, a portion 12a1 (corresponding to an example of the second portion), and a portion 12a2 (corresponding to an example of the first portion).

The portion 12a1 is formed by further providing a recess portion 12a1a and a groove 12a1b (corresponding to an example of the second groove) to the portion 2a 1 described above. The vicinity of the peripheral edge of the base portion 3d1a and the convex portion 3d1b of the seal portion 3d1 are provided in the groove 12a1b with a gap (corresponding to an example of the third gap) therebetween. The recess portion 12a1a is opened to the inner wall of the hole 2a1a and the surface of the portion 12a1 on the side of the portion 12a2. The hole 2a1c that discharges the cooling gas 3a1 is opened in a bottom surface of the recess portion 12a1a. The recess portion 12a1a may be provided in the portion 12a2.

The portion 12a2 is formed by removing the groove 2a2c from the portion 2a2 described above, and further providing an inclined surface on the surface of the portion 12a2 on the side of the portion 12a1. The inclined surface may be omitted.

In the case of the stage 2a described above, the gap provided between the first portion 2a1 and the second portion 2a2 is used as the flow path 2a3 that discharges the cooling gas 3a1. Meanwhile, in the case of the stage 12a, the recess portion 12a1a is used as a flow path 12a3 that discharges the cooling gas 3a1. For this reason, in the case of the placing unit 12, the cooling gas 3a1 is discharged to the bottom surface side of the chamber 6 through the hole 2a2a of the portion 12a2.

That is, the flow path 12a3 is not connected to the outside of the stage 12a, but is connected to the cooling nozzle 3d and the gap between the hole 2a1a of the portion 12a1 and the hole 2a2a of the portion 12a2.

The hole 2a1c is connected to the flow path 12a3 and the space between the stage 12a (portion 12a1) and the substrate 100.

Further, due to the seal portion 3d1 and the groove 12a1b provided in the portion 12a1, the cooling gas 3a1 ejected from the cooling nozzle 3d is suppressed from entering the opening of the hole 2a1a. For this reason, the generation of the cooling gas 3a1 that does not contribute to the cooling of the substrate 100 may be suppressed.

Figure 11:
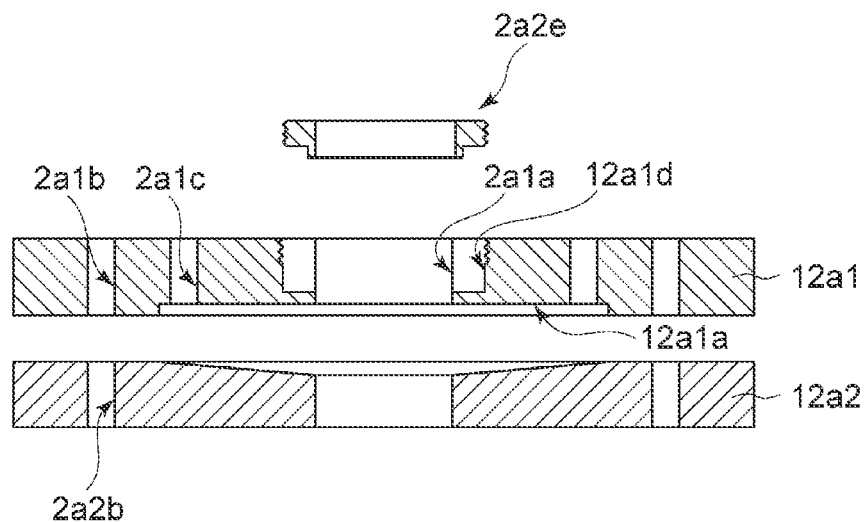
FIG. 11 is an exploded view illustrating formation of a groove.

FIG. 11 is an exploded view illustrating formation of the groove 12a1b.

As illustrated in FIG. 11, a recess portion 12a1d opened to the inner wall of the hole 2a1a of the portion 12a1 and the surface of the portion 12a1 on the side of the substrate 100 may be provided. Then, the groove 12a1b may be formed by adhering the piece 2a2e to an inner wall of the recess portion 12a1d.

When the groove 12a1b is formed by adhering the piece 2a2e to the inner wall of the recess portion 12a1d, the groove 12a1b is easily formed. Further, the portion 12a1 and the cooling nozzle 3d are easily assembled.

Figure 12:
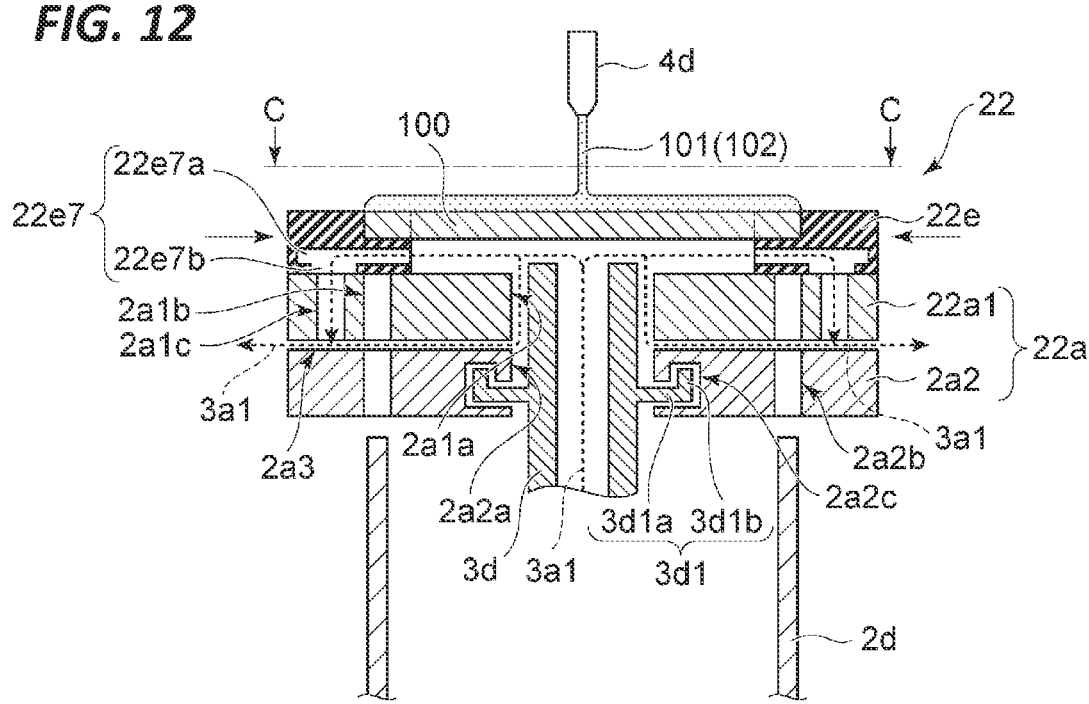
FIG. 12 is a schematic cross-sectional view illustrating a placing unit according to another embodiment.

FIG. 12 is a schematic cross-sectional view illustrating a placing unit according to another embodiment.

Figure 13:
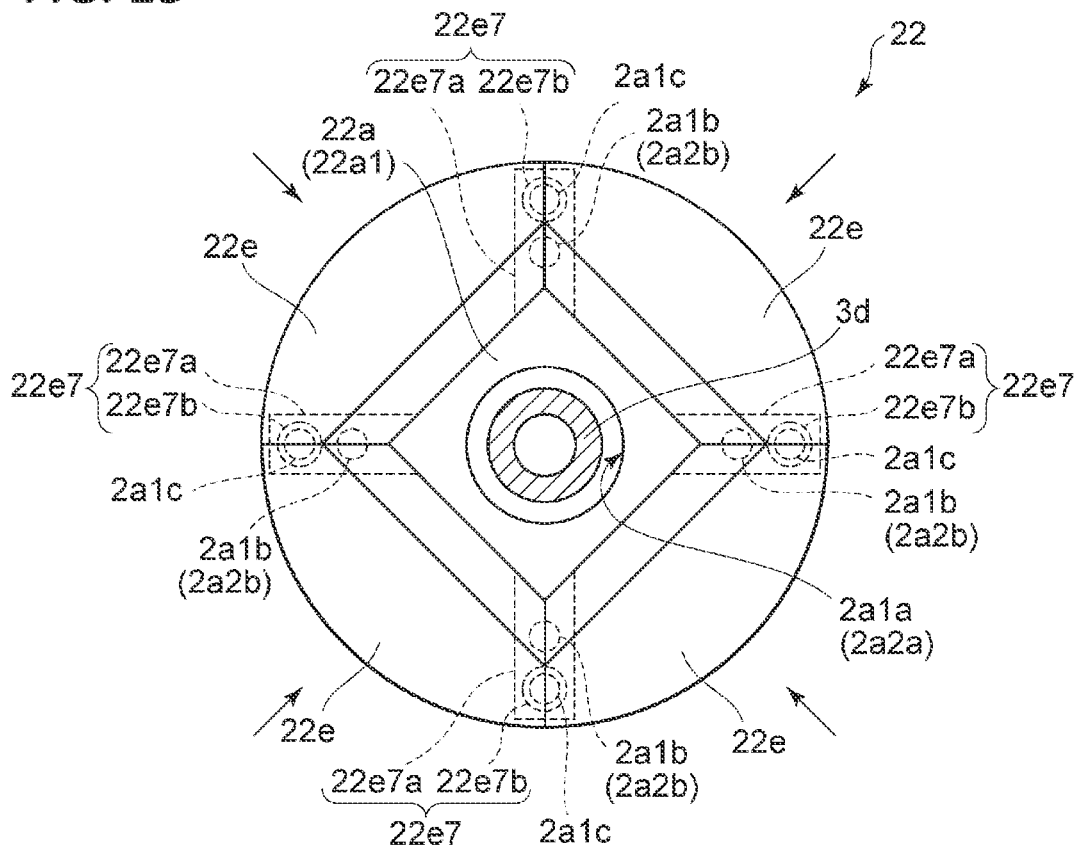
FIG. 13 is a schematic view of the placing unit in FIG. 12 taken along a line C-C.

FIG. 13 is a schematic view of the placing unit in FIG. 12 taken along a line C-C.

Figure 14:
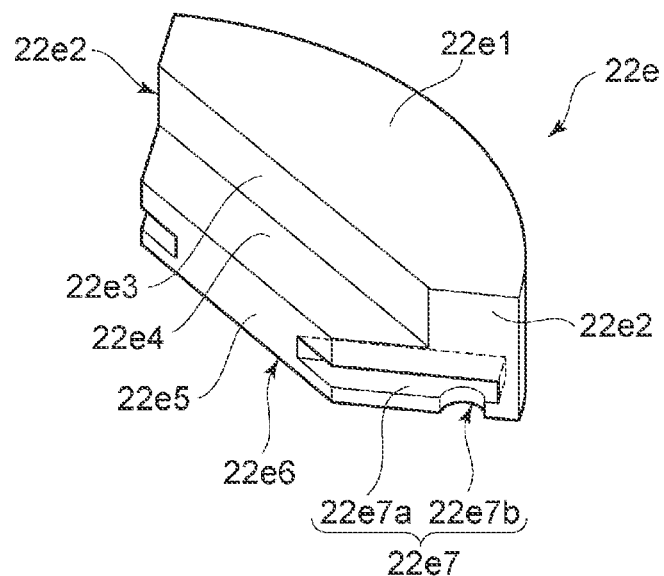
FIG. 14 is a schematic perspective view illustrating a holding unit.

FIG. 14 is a schematic perspective view illustrating a holding unit.

As illustrated in FIG. 12, a placing unit 22 includes a stage 22a, the rotation shaft 2b, the driving unit 2c, the lift pin 2d, and holding units 22e.

In FIG. 12, the rotation shaft 2b and the driving unit 2c are omitted.

The stage 22a includes, for example, a portion 22a1 (corresponding to an example of the second portion), and the portion 2a2 (corresponding to an example of the first portion).

The portion 22a1 may be the same as the portion 2a1 described above. However, the hole 2a1c (corresponding to an example of the second hole) is provided on the side of the peripheral edge of the portion 22a1 from the hole 2a1b.

As illustrated in FIGS. 12 and 13, the holding units 22e hold the substrate 100.

As illustrated in FIG. 14, the holding unit 22e has a plate shape, and includes an upper surface 22e1, a side surface 22e2, an inner side surface 22e3, a support surface 22e4, an inner peripheral surface 22e5, and a lower surface 22e6.

For example, the upper surface 22e1 may be the same as the upper surface 2e1 of the holding unit 2e described above.

For example, the side surface 22e2 may be the same as the side surface 2e2 of the holding unit 2e described above.

For example, the inner side surface 22e3 may be the same as the inner side surface 2e3 of the holding unit 2e described above.

The support surface 22e4 supports the vicinity of the peripheral edge of the substrate 100. In this case, the support surface 22e4 may be an inclined surface. When the support surface 22e4 is an inclined surface, the support surface 22e4 may be inclined with respect to the surface (back surface 100a of the substrate 100) of the stage 22a (portion 22a1). For example, the distance between the support surface 22e4 and the surface of the stage 22a (portion 22a1) may be gradually increased as it goes to the side of the inner side surface 22e3. For example, the support surface 22e4 may be the same as the inclined surface 2e4 of the holding unit 2e described above. When the support surface 22e4 is an inclined surface, the back surface 100a of the substrate 100 may be in line contact with the support surface 22e4. For this reason, it is possible to suppress the back surface 100a of the substrate 100 from being damaged.

The inner peripheral surface 22e5 is connected to an end portion of the support surface 22e4 on an opposite side to the side of the inner side surface 22e3. The inner peripheral surface 22e5 is provided below the support surface 22e4. For example, the inner peripheral surface 22e5 may be a flat surface parallel with the inner side surface 22e3.

The lower surface 22e6 faces the upper surface 22e1. The lower surface 22e6 may be a flat surface parallel with the upper surface 22e1.

Further, each of the side surfaces 22e2 on both sides may be provided with a flow path 22e7. For example, the holding unit 22e may be formed by further providing the flow path 22e7 to the holding unit 2e described above.

The flow path 22e7 includes a groove 22e7a and a hole 22e7b. The groove 22e7a is opened to the side surface 22e2 and the inner peripheral surface 22e5 of the holding unit 22e. The hole 22e7b is opened to the lower surface 22e6 of the holding unit 22e and an inner wall of the groove 22e7a.

As illustrated in FIG. 13, when the substrate 100 is held by the plurality of holding units 22e, the groove 22e7a provided in the holding unit 22e is connected to the groove 22e7a provided in the adjacent holding unit 22e. Further, the hole 22e7b provided in the holding unit 22e is connected to the hole 22e7b provided in the adjacent holding unit 22e. In this case, the hole 22e7b provided in the holding unit 22e and the hole 22e7b provided in the adjacent holding unit 22e may be positioned on the hole 2a1c provided in the portion 22a1.

For this reason, as illustrated in FIG. 12, when the substrate 100 is held by the plurality of holding units 22e, the cooling gas 3a1 supplied to the space between the stage 22a (portion 22a1) and the substrate 100 is discharged to the outside of the placing unit 22 (stage 22a) through the groove 22e7a, the hole 22e7b, the hole 2a1c, and the gap between the portion 22a1 and the portion 2a2.

As illustrated in FIG. 13, when the flow path 22e7 is provided, the hole 2a1c may be provided in the vicinity of the peripheral edge of the portion 22a1 and around the four corners of the substrate 100. For this reason, the cooling gas 3a1 supplied to the space between the stage 22a (portion 22a1) and the substrate 100 may be concentrated around the four corners of the substrate 100. Further, by flowing the cooling gas 3a1 to the hole 2a1c through the flow path 22e7, the cooling gas 3a1 may be collected around the four corners of the substrate 100. Further, the flow of the cooling gas 3a1 around the four corners of the substrate 100 may be made active. For this reason, it is possible to efficiently cool the periphery of the four corners of the substrate 100.

Further, since the cooling gas 3a1 passes through the inside of the stage 22a, the stage 22a is cooled as well. For this reason, the substrate 100 may be cooled via the stage 22a, and thus, the substrate 100 may be easily cooled.

In this case, as illustrated in FIG. 13, the groove 22e7a may be formed to be parallel with a direction toward the four corners of the substrate 100 from the center of the stage 22a.

Further, when the substrate 100 is held by the plurality of holding units 22e, the hole 2a1b through which the lift pin 2d is inserted may be blocked by the plurality of holding units 22e. In this manner, the cooling gas 3a1 supplied to the space between the stage 22a (portion 22a1) and the substrate 100 may be suppressed from being discharged through the hole 2a1b. For this reason, the cooling gas 3a1 may be easily supplied around the four corners of the substrate 100.

Figure 15:
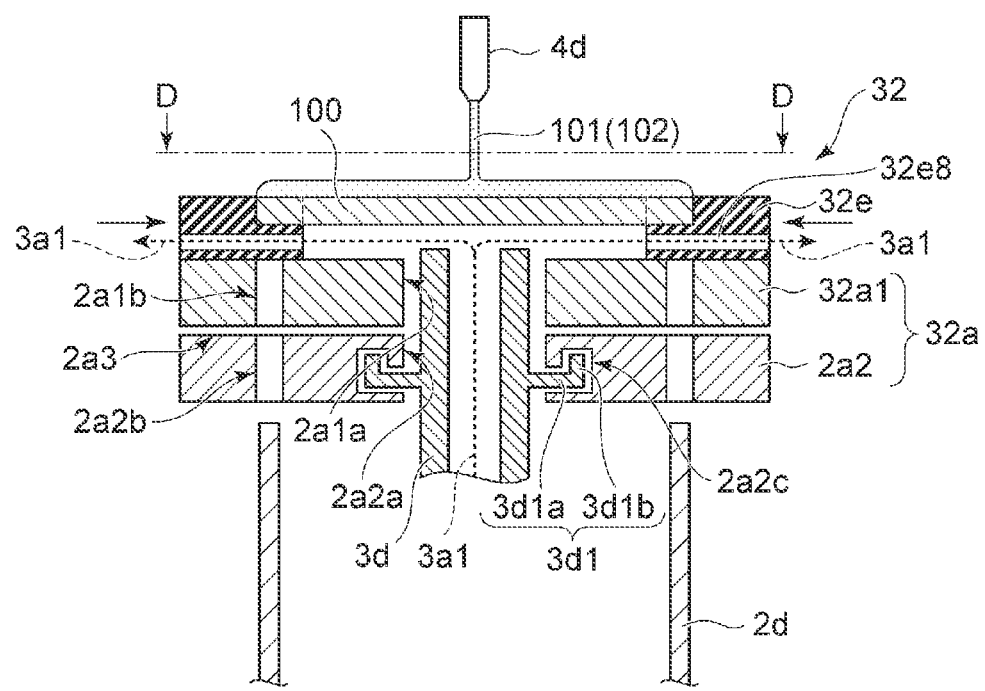
FIG. 15 is a schematic cross-sectional view illustrating a placing unit according to the other embodiment.

FIG. 15 is a schematic cross-sectional view illustrating a placing unit according to the other embodiment.

Figure 16:
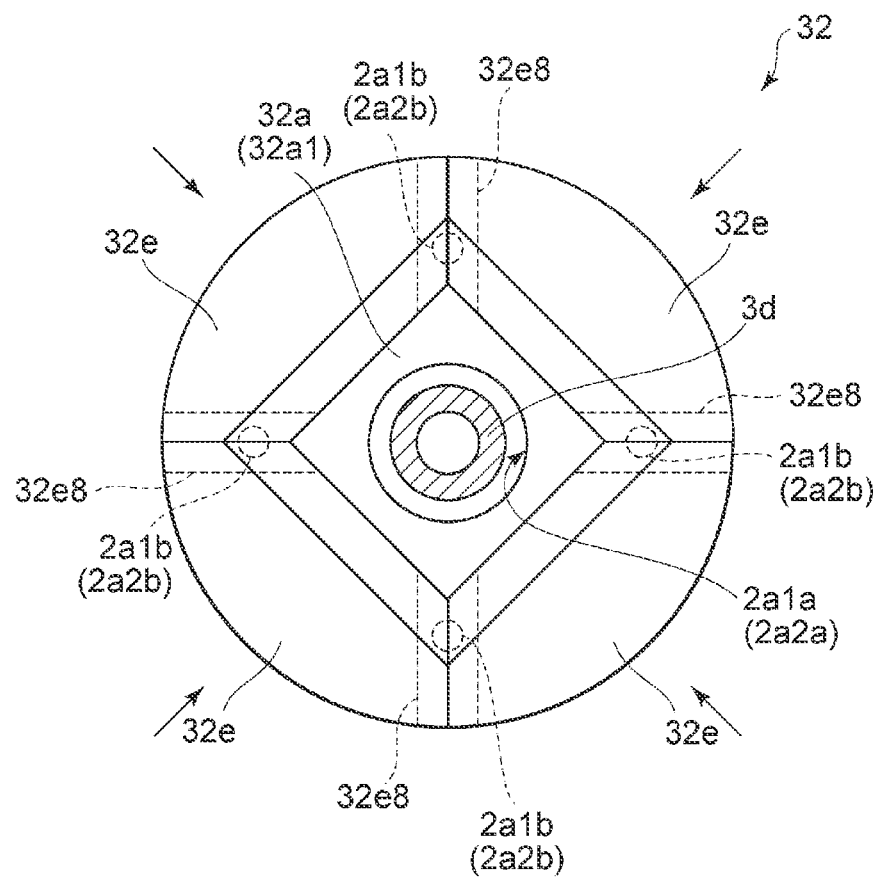
FIG. 16 is a schematic view of the placing unit in FIG. 15 taken along a line D-D.

FIG. 16 is a schematic view of the placing unit in FIG. 15 taken along a line D-D.

Figure 17:
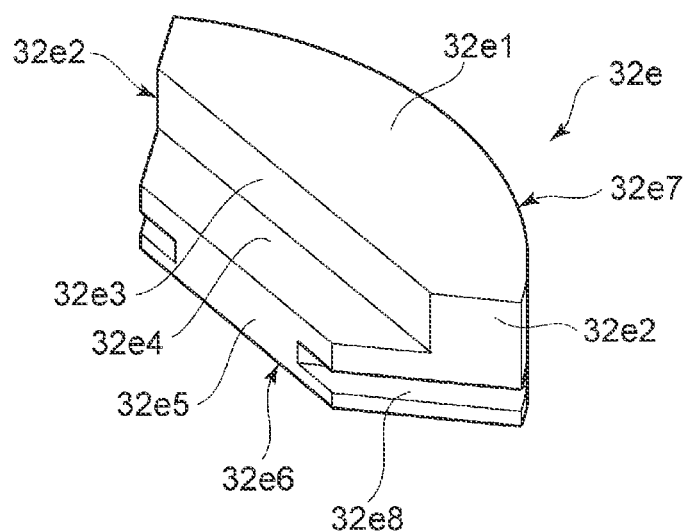
FIG. 17 is a schematic perspective view illustrating a holding unit.

FIG. 17 is a schematic perspective view illustrating a holding unit.

As illustrated in FIG. 15, a placing unit 32 includes a stage 32a, the rotation shaft 2b, the driving unit 2c, the lift pin 2d, and holding units 32e.

In FIG. 15, the rotation shaft 2b and the driving unit 2c are omitted.

The stage 32a includes, for example, a portion 32a1 (corresponding to an example of the second portion), and the portion 2a2 (corresponding to an example of the first portion).

The portion 32a1 may be the same as the portion 2a1 described above. However, the hole 2a1c is not provided in the portion 32a1.

As illustrated in FIGS. 15 and 16, the holding units 32e hold the substrate 100.

As illustrated in FIG. 17, the holding unit 32e has a plate shape, and includes an upper surface 32e1, a side surface 32e2, an inner side surface 32e3, a support surface 32e4, an inner peripheral surface 32e5, a lower surface 32e6, and an outer peripheral surface 32e7.

For example, the upper surface 32e1 may be the same as the upper surface 22e1 of the holding unit 22e described above.

For example, the side surface 32e2 may be the same as the side surface 22e2 of the holding unit 22e described above.

For example, the inner side surface 32e3 may be the same as the inner side surface 22e3 of the holding unit 22e described above.

For example, the support surface 32e4 may be the same as the support surface 22e4 of the holding unit 22e described above.

For example, the inner peripheral surface 32e5 may be the same as the inner peripheral surface 22e5 of the holding unit 22e described above.

For example, the lower surface 32e6 may be the same as the lower surface 22e6 of the holding unit 22e described above.

The outer peripheral surface 32e7 faces the inner side surface 32e3 and the inner peripheral surface 32e5. One end portion of the outer peripheral surface 32e7 is connected to a peripheral edge of the upper surface 32e1 on an opposite side to the side of the inner side surface 32e3. The other end portion of the outer peripheral surface 32e7 is connected to a peripheral edge of the lower surface 32e6 on an opposite side to the side of the inner peripheral surface 32e5.

Further, each of the side surfaces 32e2 on both sides may be provided with a flow path 32e8. For example, the holding unit 32e may be formed by changing the flow path 22e7 of the holding unit 22e described above to the flow path 32e8.

As illustrated in FIGS. 16 and 17, the flow path 32e8 is opened to the side surface 32e2, the inner peripheral surface 32e5, and the outer peripheral surface 32e7.

As illustrated in FIG. 16, when the substrate 100 is held by the plurality of holding units 32e, the flow path 32e8 provided in the holding unit 32e is connected to the flow path 32e8 provided in the adjacent holding unit 32e.

For this reason, as illustrated in FIG. 15, when the substrate 100 is held by the plurality of holding units 32e, the cooling gas 3a1 supplied to the space between the stage 32a (portion 32a1) and the substrate 100 is discharged to the outside of the placing unit 32 (stage 32a) through the flow path 32e8.

As illustrated in FIG. 16, when the flow path 32e8 is provided, the cooling gas 3a1 supplied to the space between the stage 32a (portion 32a1) and the substrate 100 may be collected around the four corners of the substrate 100. Further, the flow of the cooling gas 3a1 around the four corners of the substrate 100 may be made active. For this reason, it is possible to efficiently cool the periphery of the four corners of the substrate 100.

In this case, as illustrated in FIG. 15, the flow path 32e8 may be formed to be parallel with a direction toward the four corners of the substrate 100 from the center of the stage 32a.

Further, when the substrate 100 is held by the plurality of holding units 32e, the hole 2a1b through which the lift pin 2d is inserted may be blocked by the plurality of holding units 32e. In this manner, the cooling gas 3a1 supplied to the space between the stage 32a (portion 32a1) and the substrate 100 may be suppressed from being discharged through the hole 2a1b. For this reason, the cooling gas 3a1 may be easily supplied around the four corners of the substrate 100.

That is, the placing unit 32 according to the present embodiment may also have the same effect as that of the placing unit 22 described above.

Here, as described above, when the cooling gas 3a1 simply flows to the outside of the substrate 100, due to the moisture contained in the atmosphere in which the freeze cleaning processing is performed, frost may be generated in the vicinity of the peripheral edge of the substrate 100.

However, as illustrated in FIG. 17, the flow path 32e8 is opened to the outer peripheral surface 32e7. For this reason, as illustrated in FIG. 15, the position where the cooling gas 3a1 is discharged to the outside of the placing unit 32 may be separated from the peripheral edge of the substrate 100. When the position where the cooling gas 3a1 is discharged to the outside of the placing unit 32 is separated from the peripheral edge of the substrate 100, it is possible to suppress frost from being generated in the vicinity of the peripheral edge of the substrate 100 due to the moisture contained in the atmosphere in which the freeze cleaning processing is performed.

For example, the shape, size, number, and arrangement of each component provided in the substrate processing apparatus 1 are not limited to those illustrated, and can be changed as appropriate.

Further, in the above, the case where the planar shape of the substrate 100 is a quadrilateral is illustrated, but the same can be applied to a case where the planar shape of the substrate 100 is a circle or the like.

From the foregoing, it will be appreciated that various embodiments of the present disclosure have been described herein for purposes of illustration, and that various Modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing apparatus comprising:
   a stage configured to rotate around a central axis;
   a plurality of holders provided on the stage and configured to hold a substrate;
   a cooler configured to supply a cooling gas to a space between the stage and the substrate; and
   a liquid supply configured to supply a liquid to a surface of the substrate on an opposite side to the stage,
   wherein, when holding the substrate, the plurality of holders moves toward the central axis of the stage along a surface of the stage to surround a peripheral edge of the substrate in its entirety, thereby closing the space between the stage and the substrate.

2. The substrate processing apparatus according to claim 1, wherein the stage includes a first portion having a plate shape, and a second portion having a plate shape and provided on the first portion, and
   a flow path is provided between the first portion and the second portion to discharge the cooling gas supplied to the space between the stage and the substrate to an outside of the stage.

3. The substrate processing apparatus according to claim 2, wherein the second portion includes a first hole and a second hole that penetrate therethrough in a thickness direction,
   the first portion includes a third hole that penetrates therethrough in a thickness direction and is provided concentrically with the first hole,
   the cooler has a cylindrical shape and includes a cooling nozzle provided in the first hole and the third hole with a first gap therebetween,
   the flow path is connected to the outside of the stage and the first gap, and
   the second hole is connected to the flow path and the space between the stage and the substrate.

4. The substrate processing apparatus according to claim 3, further comprising:

a base having a plate shape and provided on an outer surface of the cooling nozzle; and
a protrusion having an annular shape and provided in a vicinity of a peripheral edge of the base,
wherein a first groove is provided in an inner wall of the third hole of the first portion, and
the vicinity of the peripheral edge of the base, and the protrusion are provided in the first groove with a second gap therebetween.

5. The substrate processing apparatus according to claim 3, wherein the second portion includes a plurality of second holes provided at positions point-symmetrical about the central axis of the stage.

6. The substrate processing apparatus according to claim 2, wherein the second portion includes a first hole and a second hole that penetrate therethrough in a thickness direction,
the first portion includes a third hole that penetrates therethrough in a thickness direction and is provided concentrically with the first hole,
the cooler has a cylindrical shape and includes a cooling nozzle provided in the first hole and the third hole with a first gap therebetween,
the flow path is disconnected from the outside of the stage and is connected to the first gap, and
the second hole is connected to the flow path and the space between the stage and the substrate.

7. The substrate processing apparatus according to claim 6, further comprising:
a base having a plate shape and provided on an outer surface of the cooling nozzle; and
a protrusion having an annular shape and provided in a vicinity of a peripheral edge of the base,
wherein a second groove is provided in an inner wall of the first hole of the second portion, and
the vicinity of the peripheral edge of the base, and the protrusion are provided in the second groove with a third gap therebetween.

8. The substrate processing apparatus according to claim 1, wherein a surface of the holder has a liquid repellency with respect to the liquid.

9. The substrate processing apparatus according to claim 1, wherein a portion of the holder holding the substrate is covered with a resin.

10. The substrate processing apparatus according to claim 1, wherein each of the plurality of holders is movable in a direction away from the central axis of the stage.

* * * * *